United States Patent
Shao

(10) Patent No.: US 6,387,795 B1
(45) Date of Patent: May 14, 2002

(54) WAFER-LEVEL PACKAGING

(75) Inventor: Tung-Liang Shao, Taoyuan (TW)

(73) Assignee: Apack Technologies Inc., Hsinchu (TW)

( * ) Notice: Subject to any disclaimer, the term of this patent is extended or adjusted under 35 U.S.C. 154(b) by 0 days.

(21) Appl. No.: 09/854,112

(22) Filed: May 11, 2001

(30) Foreign Application Priority Data

Mar. 22, 2001 (TW) .......................................... 90106703

(51) Int. Cl.$^7$ .............................................. H01L 21/44
(52) U.S. Cl. ........................ 438/613; 438/108; 438/110; 438/113; 438/114; 438/612; 438/614; 438/460; 438/462; 228/180.21; 228/180.22
(58) Field of Search ................................ 438/108, 110, 438/113, 114, 612, 613, 614, 462, 460; 228/180.21, 180.22

(56) References Cited

U.S. PATENT DOCUMENTS 4,950,623 A * 8/1990 Dishon ....................... 437/183
5,045,918 A * 9/1991 Cagan et al. ................. 357/72

* cited by examiner

*Primary Examiner*—John F. Niebling
*Assistant Examiner*—David A. Zarneke
(74) *Attorney, Agent, or Firm*—J. C. Patents

(57) ABSTRACT

A wafer-level packaging process. A wafer having a plurality of bonding pads thereon exposed through a passivation layer formed on the wafer is provided, and an under bump metal (UBM) is formed on each bonding pad. A stress buffer layer is formed through which are formed a plurality of first openings that expose the under bump metals (UBM). Solder material is filled in the first openings of the stress buffer layer. Either a stencil or a patterned photoresist having a plurality of second openings is arranged on the stress buffer layer such that the second openings expose the first openings. A solder material is filled in the second openings. The solder material is reflowed, wherein if the stencil is used, it is removed before the reflow process while if the patterned photoresist is used, it is removed after the reflow process.

6 Claims, 2 Drawing Sheets ional view schematically illustrating a structure of the wafer after a wafer-level packaging has been achieved according to a preferred embodiment of the present invention.

WAFER-LEVEL PACKAGING

CROSS-REFERENCE TO RELATED APPLICATION

This application claims the priority benefit of Taiwan application serial no. 90106703, filed on Mar. 22, 2001.

BACKGROUND OF THE INVENTION

1. Field of the Invention

The invention relates to a wafer-level packaging. More particularly, the invention relates to a wafer-level packaging suitable for use with a flip-chip connection.

2. Description of the Related Art

As electronic technology progresses, the miniaturization of electronic products is increasingly emphasized. This miniaturization results in a more complicated and denser structure of electronic products. In electronic industries, the packaging of electronic devices thus requires package structures that have small dimensions and high density. In this context, many types of packaging structures are developed, such as ball grid array (BGA) packages, chip-scale packages (CSP), flip-chip (F/C) structure packages, multi-chip module (MCM) packages, etc.

Among the above-mentioned types of packaging structures, the flip-chip structure packages advantageously allow for a packaging structure that has a small surface, high pin counts, a short signal path, a low induction and a control of noise signals. Thus, the flip-chip structure is increasingly used in packaging electronic devices.

In the traditional flip-chip structure, an underfill must be filled between the chip and the carrier or printed circuit substrate onto which the chip is connected. The underfill can share the thermal stress generated between the carrier and the chip due to different coefficients of thermal expansion of the carrier and the chip. As a result, the bumps that electrically connect the chip to the carrier can be prevented from fatigue resulting from the thermal cycle.

However, with a packaging structure that is increasingly denser, the pitch between the bumps formed on the chip is consequently reduced. In a flip-chip structure, effectively filling the underfill without voids thus becomes difficult and increases the manufacturing cost. Solutions that can overcome the above-described problems to allow for a reliable flip-chip structure are thus needed.

SUMMARY OF THE INVENTION

An aspect of the present invention is to provide a wafer-level packaging in which a patterned stress buffer layer is adequately formed over the wafer to substitute for a conventional underfill process, such that the packaging can be simply achieved with a reduced cost.

To attain the foregoing and other aspects, the present invention, according to a first preferred embodiment, provides a wafer-level packaging comprising: providing a wafer having a plurality of bonding pads thereon exposed through a passivation layer formed on the wafer, an under bump metal (UBM) being formed on each of the bonding pads; forming a stress buffer layer that can be patterned over the wafer, wherein using the pattern property of the stress buffer layer, a plurality of first openings are formed in the stress buffer layer exposing the under bump metals (UBM); filling a solder material in the first openings of the stress buffer layer; arranging either a stencil or a patterned photoresist having a plurality of second openings on the stress buffer layer such that the second openings expose the first openings; filling a solder material in the second openings; and performing a reflow process, wherein if the stencil is used, it is removed before the reflow process while if the patterned photoresist is used, it is removed after the reflow process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
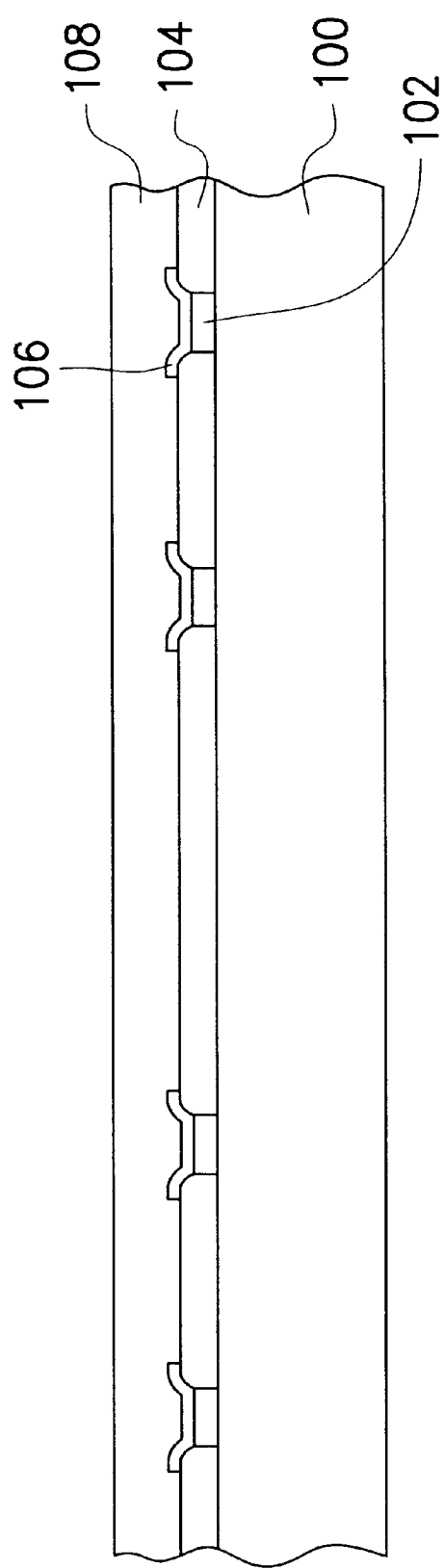
FIG. 1 is a cross-sectional view schematically illustrating a wafer with a stress buffer layer formed thereon in an intermediary stage of a wafer-level packaging according to a preferred embodiment of the present invention.
Figure 2:
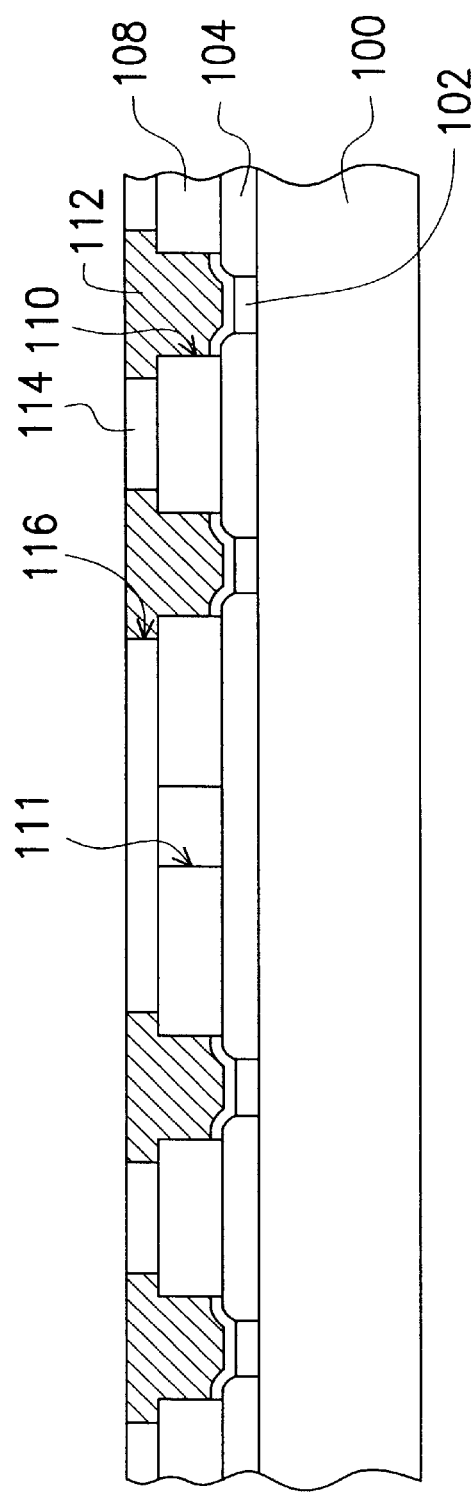
FIG. 2 is a cross-sectional view schematically illustrating a wafer after solder material is filled in a patterned stress buffer layer, in an intermediary stage of a wafer-level packaging according to a preferred embodiment of the present invention.
Figure 3:
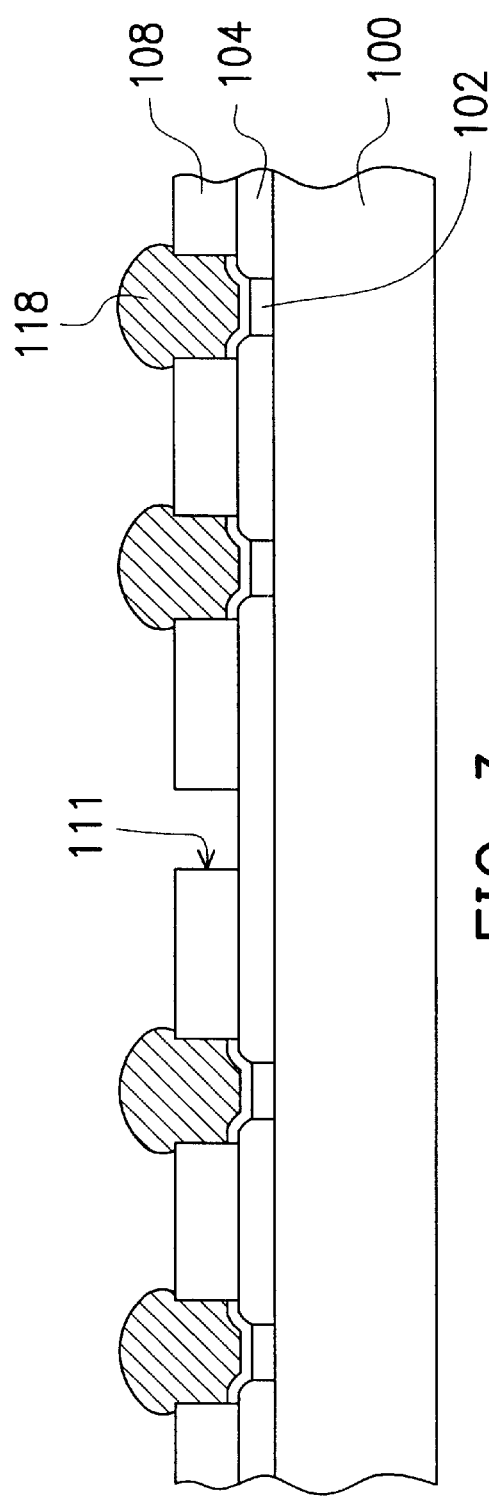
FIG. 3 is a cross-sectional view schematically illustrating a structure of the wafer after a wafer-level packaging has been achieved according to a preferred embodiment of the present invention.

Referring now to FIG. 1 through FIG. 3, various cross-sectional views schematically illustrate various stages in a wafer-level packaging according to a preferred embodiment of the present invention.

With reference to FIG. 1, a wafer 100 is provided with a plurality of bonding pads 102 thereon. A passivation layer 104 is formed on the surface of the wafer 100 and exposes the bonding pads 102. An under bump metal (UBM) 106 is respectively formed on the exposed bonding pads 102. Then, a stress buffer layer 108 is formed over the wafer 100. The stress buffer layer 108 is made of a material that advantageously can share stress and be patterned.

Next referring to FIG. 2, a plurality of first openings 110 and a plurality of cutting paths 111 are formed in the stress buffer layer 108. The first openings 110 are formed to respectively expose the under bump metals (UBM) 106. The cutting paths 111 serves as mark zones after packaging, such that a subsequent dicing can be effectively performed without misalignment problems. The cutting paths 111 also can advantageously prevent the wafer 100 from warping when the wafer is heated during an encapsulating process.

Then, a stencil or patterned photoresist 114 having a plurality of second openings 116 therein, is formed on the stress buffer layer 108 in such a manner that the second openings 116 respectively expose the first openings 110. Then, a solder material 112 is filled in the first and second openings 110 and 116. The solder material can be filled by, for example, screen printing.

Next referring to FIG. 3, a reflow of the solder material then is performed. If a stencil 114 has been used to fill the solder material during screen printing, the stencil then should be removed before reflowing. If a patterned photoresist 114 has been used, then the reflow of the solder material is first performed, and then the patterned photoresist is removed.

Another possible example of the present embodiment is to fill the solder material in two steps. The solder material is first filled in the first openings 110 after the first openings 110 are defined in the stress buffer layer 108. After the stencil or patterned photoresist 114 with the second openings 116 is arranged on the stress buffer layer 108, the solder material is filled a second time in the second openings 116 such as described above.

During reflowing, an action of internal cohesion forces in the solder material turns the solder material into a plurality of round-shaped bumps 118.

With the above method, the conventional underfill process that is difficult to perform thus can be advantageously substituted with a simple process in which a stress buffer layer is directly patterned to define therein the cutting paths and bumps. The cost of the wafer-level packaging thus is advantageously reduced. The cutting paths that are directly defined by patterning the stress buffer layer can advantageously prevent the wafer from being warped when subjected to subsequent heating during encapsulating. Moreover, the cutting paths conveniently serve as mark zones for subsequent dicing after the packaging of the wafer. Another advantage is that if the pitch of the bumps is reduced, the method of the present invention can effectively overcome the limitations of the conventional underfill process.

It will be apparent to those skilled in the art that various modifications and variations can be made to the structure of the present invention without departing from the scope or spirit of the invention.

What is claimed is:

1. A wafer-level packaging comprising:

providing a wafer that has a plurality of bonding pads formed thereon, an under bump metal (UBM) being respectively formed on the bonding pads that are exposed through a patterned passivation layer formed on the wafer;

forming a stress buffer layer that can be patterned on the wafer;

patterning the stress buffer layer to form a plurality of first openings and cutting paths, the first openings exposing the under bump metals (UBM);

filling a first solder material in the first openings;

arranging a mask on the stress buffer layer, wherein the mask has a plurality of second openings communicating with the first openings;

filling the second openings of the mask with a second solder material; and reflowing the first and second solder materials to form a plurality of bumps as external connections for the wafer.

2. The wafer-level packaging of claim 1, wherein the mask is a stencil.

3. The wafer-level packaging of claim 1, wherein the mask is a photoresist layer.

4. The wafer-level packaging of claim 1, wherein the first and second solder materials are tin-lead pastes that can have different tin-lead ratios.

5. The wafer-level packaging of claim 1, wherein the stress buffer layer is further patterned to form a plurality of cutting paths used for subsequent wafer dicing.

6. The wafer-level packaging of claim 5, wherein the pattern of the stress buffer layer in the cutting paths is such that a warpage of the wafer after a subsequent heating can be substantially reduced.

* * * * *